United States Patent
Premerlani et al.

(10) Patent No.: US 7,472,026 B2
(45) Date of Patent: Dec. 30, 2008

(54) MULTI-ENDED FAULT LOCATION SYSTEM

(75) Inventors: William J. Premerlani, Scotia, NY (US); Bogdan Z. Kasztenny, Markham (CA); Mark G. Adamiak, Paoli, PA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/615,103

(22) Filed: Dec. 22, 2006

(65) Prior Publication Data

US 2008/0150544 A1    Jun. 26, 2008

(51) Int. Cl.
G06F 19/00 (2006.01)
G01R 31/00 (2006.01)

(52) U.S. Cl. .......................... 702/59; 361/80; 324/525; 340/870.16; 340/3.43

(58) Field of Classification Search ................ 702/59, 702/64, 71, 94, 150; 361/80, 81; 324/525, 324/522; 340/870.16, 3.43, 3.44
See application file for complete search history.

(56) References Cited

U.S. PATENT DOCUMENTS

| | | | |
|---|---|---|---|
| 4,725,914 A | * | 2/1988 | Garitty .................. 361/76 |
| 4,871,971 A | * | 10/1989 | Jeerings et al. ............ 324/509 |
| 6,256,592 B1 | | 7/2001 | Roberts et al. |
| 6,879,917 B2 | | 4/2005 | Turner |

OTHER PUBLICATIONS

Hou et al., 'Deterministic High-Impedance Fault Detection and Phase Selection on Undergrounded Distribution Systems', 2005, SEL Publication, pp. 1-10.*
Jiang et al., 'An Adaptive Fault Locator System for Transmission Lines', 1999, IEEE Publicaiton, pp. 930-936.*
Guzman et al., 'Transmission Line Protection System for Increasing Power System Requirement', 2001, SEL Publication, pp. 1-23.*
Jiang et al., 'A Composite Index to Adaptively Perform Fault Detection, Classification, and Direction Discrimination for Transmission Lines', 2002, IEEE Publication, pp. 912-917.*

* cited by examiner

*Primary Examiner*—Edward Raymond
*Assistant Examiner*—Elias Desta
(74) *Attorney, Agent, or Firm*—GE Global Patent Operation

(57) ABSTRACT

A system and method for locating faults on multi-terminal power system transmission lines uses synchronized phasor measurements to accurately determine fault location and fault impedance regardless of fault type, fault resistance, and coupling to other adjacent power system transmission lines.

28 Claims, 4 Drawing Sheets

MULTI-ENDED FAULT LOCATION SYSTEM

FIELD AND BACKGROUND OF THE INVENTION

The field of the invention relates to identification and location of faults in electrical power transmission lines.

The ability to accurately determine the location of faults on power system lines and estimate the approximate fault impedance are important as they facilitate fast dispatch of the field crews, faster inspection and shorter repair times all leading to faster restoration of the affected transmission line. At the same time accurate fault location is a technical challenge primarily because the fault location estimation is done based on very limited amount of information gathered at the line terminals only. Problems which must be overcome include finite modeling accuracy of transmission lines, instrument measurement errors, errors in the estimation of parameters of the line and system models, coupling to adjacent power system transmission lines, unknown and often non-linear fault resistance, finite duration of faults resulting in short time window of available data.

Fault location is commonly performed as an adjunct to the functioning of distance-based power system protective relays. The most common approaches use voltage and current measurements from a single line terminal to estimate the fault location using various assumptions and approximations. Such approaches are referred to as single-ended methods and are not very accurate. The lack of absolute accuracy is primarily a result of having more unknowns than equations that could be derived from the line and system model based on measurements from one end of the line. As a result assumptions are made. Various assumptions yield various single-ended fault location methods. When the assumptions are satisfied in a given fault situation, the fault location result is accurate. If the assumptions are not satisfied, an inherent, sometimes very significant, error of the method will occur.

Fault location systems that utilize information from more than one line terminals are referred to as multi-ended fault locators. A multi-ended fault locator eliminates the key weakness of a single-ended approach, but requires communication channels to rely data from geographically dispersed line terminals to a single location where the actual fault location calculations are performed. Some multi-ended fault location methods also require synchronization of the data between the line terminals. These two requirements make the multi-ended fault location methods difficult to implement. U.S. Pat. No. 6,256,592, for example, describes a multi-ended system for locating a fault on a power line using the magnitude value of the negative sequence current and the magnitude and angle values of the negative sequence impedance at the time the fault occurs. The magnitude and angle information is transmitted between two terminals of the multi-ended system so that the fault location point can be determined from the information. U.S. Pat. No. 6,256,592 uses the negative sequence current information to produce results in near real time by reducing the amount of data that must be transmitted between terminals. U.S. Pat. No. 6,879,917 uses positive- or negative-sequence currents and voltages to locate faults. Most fault types are covered by the negative-sequence method of the patent. Three-phase balanced faults do not produce any negative-sequence signals rendering the negative-sequence method of U.S. Pat. No. 6,879,917 useless. Therefore the said patented method adds the positive-sequence based equations to eliminate this weakness. As a result, two sets of calculations must be run in parallel, or a coarse fault type identification must be performed.

The need for fault type identification is a weakness for real-time systems with limited communication bandwidth. The remote portion of the locator needs to send both negative- and positive-sequence based signals, or the two portions of the locator must work flawlessly in terms of fault type identification. If one portion sends the negative-sequence based information, while the other portion combines it with the positive-sequence based information, significant errors in the fault distance estimate will occur.

A typical single- or multi-ended fault locator requires knowledge of the fault type, i.e. which and how many conductors are involved in the fault, knowledge of the mutual coupling to adjacent lines located on the same towers or in close proximity, and some other auxiliary information. These extra factors are found through separate procedures, and if delivered to the main fault location procedure with errors, they will impact the overall fault location accuracy.

A need still exists for other methods of accurately determining fault position on a power transmission line, which can further reduce error and produce results quickly following a fault. For multi-ended systems working in real or near-real time, such as locators integrated with protection relays, it is important to limit the bandwidth requirements for communications, and in particular, the amount of information that needs to be sent between different terminals of the transmission line.

BRIEF DESCRIPTION OF THE INVENTION

A fault position detection system in accordance with an embodiment of the invention utilizes synchronized phasor measurements of uniquely designed composite currents and voltages from all ends of a power transmission line and basic network equations. The system is applicable to transmission lines having two or more terminals. Using only the specially created composite signals, the method does not require the knowledge of the fault type, fault resistance, the amount of mutual coupling with adjacent lines, or the zero-sequence impedance of the given line. The capability of ignoring the last value makes the method very useful for application on cable lines where the zero-sequence impedance varies and is difficult to deal with.

In a further embodiment of the invention, once the fault is located, the fault impedance is estimated. In yet another embodiment of the location, the system is compensated for the effects of line charging currents.

The various features of novelty which characterize the invention are pointed out with particularity in the claims annexed to and forming a part of this disclosure. For a better understanding of the invention, its operating advantages and benefits obtained by its uses, reference is made to the accompanying drawings and descriptive matter. The accompanying drawings are intended to show examples of the many forms of the invention. The drawings are not intended as showing the limits of all of the ways the invention can be made and used. Changes to and substitutions of the various components of the invention can of course be made. The invention resides as well in sub-combinations and sub-systems of the elements described, and in methods of using them.

DETAILED DESCRIPTION OF THE INVENTION

The fault detection system of the invention embodied herein is based on the idea that synchronized voltage and current measurements at all ends of the transmission line make it possible to use network equations directly to compute the fault location without assumptions or approximations, using the composite signals and associated network only. The composite signal is created in such a way that regardless of the fault type, there is a disturbance in the composite signals. The composite voltage at the fault can be computed from each end of the line by subtracting the line drop to the fault from the voltage at that end using the composite voltages at the terminals, composite currents and appropriate impedance. There are more equations in this composite signal model than unknowns, so that it possible to solve for the fault location that will match the fault voltage estimates made from all ends of the line. This simplifies the system and makes it highly accurate by removing both assumptions and model parameters that may have inherent accuracy limitations such the zero-sequence impedance of the line. The systems and calculations for two-ended and three-ended systems are similar and will be described further herein, first in summary, and then with reference to the attached drawings.

The two-ended system executes an algorithm on measurements separately on each terminal. Either result is sufficient to locate the fault. Both terminals will compute exactly the same fault location, since they use exactly the same equations applied to the same data. This could be summarized that the calculations are symmetrical in terms of identical equations executed at both ends of the line, and redundant in terms of the results remaining in the a priori known relationship. Thus, the two-ended system can compare the results of the calculations to ensure accuracy. In a further embodiment of the two-ended system, the system can be configured to subsequently calculate fault resistance at each terminal from the fault location plus local measurements, so that each terminal may compute a slightly different estimate. The two estimate values can be averaged to increase accuracy.

The three-terminal system executes an algorithm at each terminal that has information from all three terminals. In the case where one communication channel is down, this may be only one of the three terminals. The system algorithm has two parts—one part that determines which line segment is faulted, and a second part that locates the fault on the faulted segment. As with the two-terminal system, the algorithm will calculate exactly the same fault location from each terminal. However, each terminal may report a slightly different fault resistance. The accuracy of the fault resistance calculation can be increased by averaging the determined value obtained from each terminal in a subsequent step.

Figure 1:
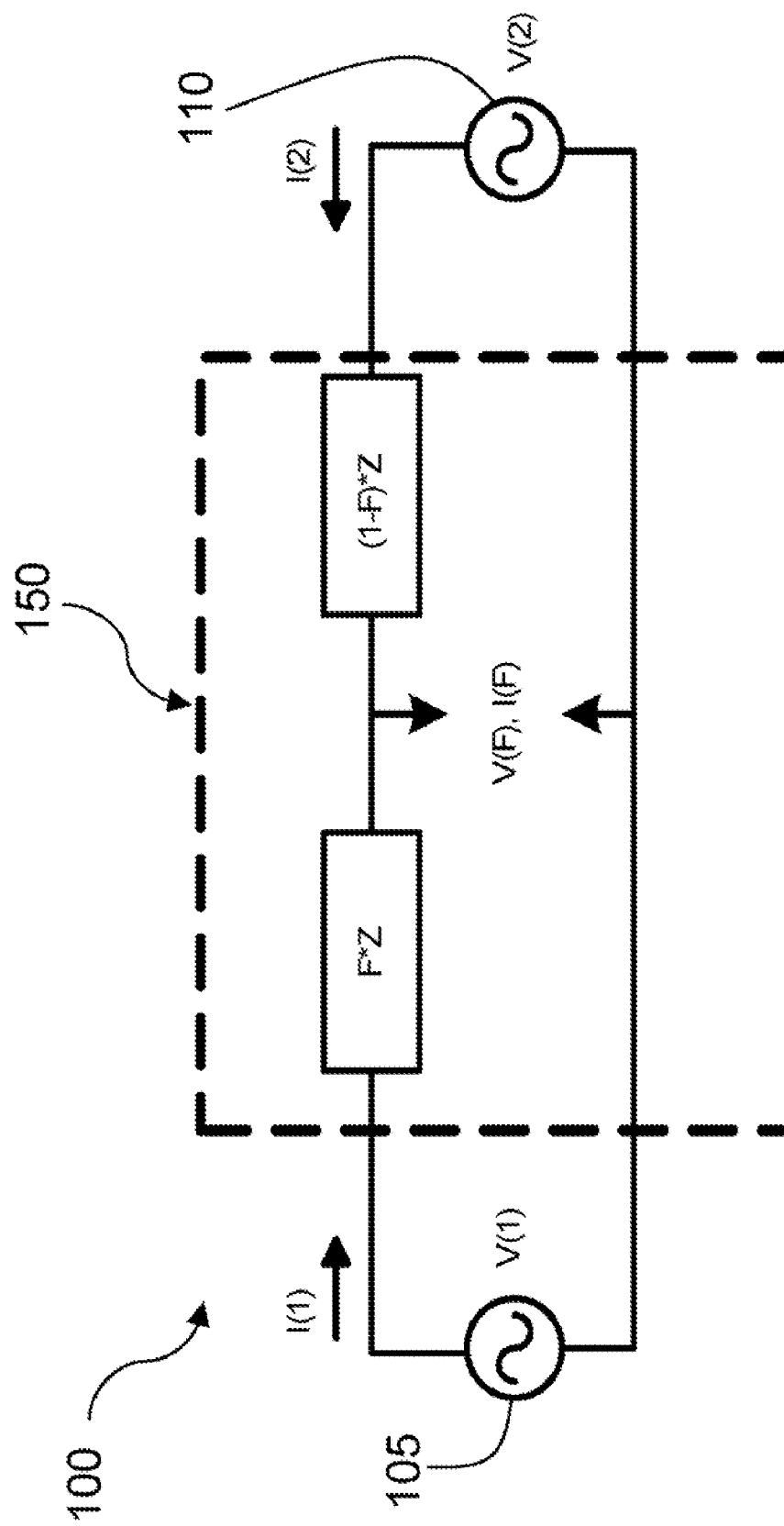
FIG. 1 is a schematic circuit diagram of a two-terminal fault detection system in accordance with one embodiment of the invention.

Referring now to the drawings in which like reference numerals are used to indicate the same or related elements, FIG. 1 illustrates a composite signal network 100 for a two-terminal power transmission line. A disturbance in the composite signal network at the fault location between first and second terminals 105, 110, respectively, characterizes the fault 150. The fault location algorithm of the system does not need to explicitly determine the composite voltage at the fault 150. Instead, it eliminates the fault voltage V(F) from the equations for fault location by using other information instead.

The system algorithm is based upon the following fault measurements and settings:

I(1)=composite current phasor flowing into the line at first terminal 105

I(2)=composite current phasor flowing into the line at second terminal 110

V(1)=composite voltage phasor at first terminal 105

V(2)=composite voltage phasor at second terminal 110

Z=complex line impedance

L=line length between first and second terminals 105, 110

The composite signals must be defined first. These signals are selected with the objective to provide for non-zero operating quantity for any fault type (symmetrical, unbalanced, with ground or isolated from the ground) so that the fault type identification is not required prior to creating such composite operating signal. Another objective is to create the composite signal in such a way that the effect of currents flowing to the ground is eliminated. This is to increase accuracy with respect to mutual coupling effects with other lines. Yet another objective is to represent the situation with a single current and voltage so that minimum amount of data is exchanged between the parts of the fault location system placed at various terminals of the transmission line.

This invention uses generalized Clarke transform to represent voltages and currents for the purpose of fault locating. The traditional Clarke transform works for both instantaneous and phasor values, and uses the following equation for one of its components:

$$V=(1/3)*(2*VA-VB-VC) \quad (1)$$

The above has a weakness of zeroing out for BC faults, and as such does not meet the requirement of delivering a signal representing the fault under all circumstances. Therefore equation (1) is generalized by this invention as follows:

$$V=(1/3)*(2*VA-b*VB-(b*)*VC) \quad (2)$$

Where b is a complex number given by:

$$b=1+j*\tan(alpha) \quad (3a)$$

and b* is a conjugate of b, or mathematically:

$$b*==1-j*\tan(alpha) \quad (3b)$$

where alpha is an arbitrary angle. Note that with alpha=0, the generalized Clarke transform of this invention becomes the traditional Clarke transform. One particular implementation of the disclosed method uses alpha=pi/4, or 45 degrees. It shall be noted, however, that many angles meet the requirements of representing any type of fault and being not sensitive to the ground current coupling. Also, it shall be noted that many other combinations of the phase signals (A,B,C) make the requirements of representing any type of fault and being not sensitive to the ground current coupling. This invention claims a method in which a single signal is created to represent the three measured signals (A,B,C) for the fault location purposes, in such a way that the ground currents do not affect the said signal, and the said signal is non-zero for all fault types. Therefore equations (1) through (3) are just examples, and those skilled in the art can derive many alternatives of this approach.

Both phase currents (IA,IB,IC) and voltages (VA,VB,VC) at all the points of interest are converted into the composite signal such as the generalized Clarke transform using the same transformation method throughout the network of interest. This conversion takes place in the apparatus that locates the faults, and is performed mathematically on all signals when deriving the fault location method and equations.

In the case of phase current measurements that are compensated for charging current of the transmission line, the compensated phase current phasors are used when deriving the composite current signals, and will provide a fault location estimate that takes full advantage of the compensation. Effects of charging current are described further below.

From this point on all calculations refer to the composite currents and voltages.

It is desired to know the fault location in either fractional or absolute units:

F=fractional fault location from first terminal 105

D=F·L=distance from first terminal 105 to fault 150 location

It should be noted that the above straight proportion between the fractional fault location and distance to fault applies for homogeneous lines, that is, lines where the impedance is distributed uniformly along the length of the line. For non-homogeneous lines, the straight proportion does not apply. However the method of this disclosure can easily be expanded on non-homogeneous lines. For simplicity of explanation, the case of homogeneous lines is considered in the following description.

The fractional fault location is given by:

$$F = \text{Real}\left[\frac{\frac{V(1) - V(2)}{Z} + I(2)}{I(1) + I(2)}\right] \quad (4)$$

Equation (4) takes advantage of redundancy in the data. There are more equations than unknowns, so a least mean squares fit is used. The equation is independent of faulted phase, fault type, fault resistance, and zero-sequence (ground current) coupling to an adjacent transmission line, if any.

It is important to understand the value of the total line impedance of the transmission line, Z, used in equation (4). This value is a complex ratio of the composite voltage and composite current measured at one end of the line with the other end under fault. Note that the fault type is not relevant, and the said ratio, will be the same regardless of the fault type. Practically this impedance is equal to the negative or positive sequence impedance of the line and is readily available.

Equation (4) can be computed at either or both first and second terminals 105, 110, producing exactly the same fault location estimate, except measured from opposite ends of the line. As one will recognize, the roles of the two terminals 105, 110 are exchanged when changing the terminal at which equation (1) is computed. The two F values should sum identically to 1.

It can be shown that the error produced by equation (1) as a result of measurement and parameter error is equal to ½ of the worst relative sensor error, such as a CT type device error. That comes out to be 2.5-5% for typical CT and fault location instrumentation errors.

Figure 2:
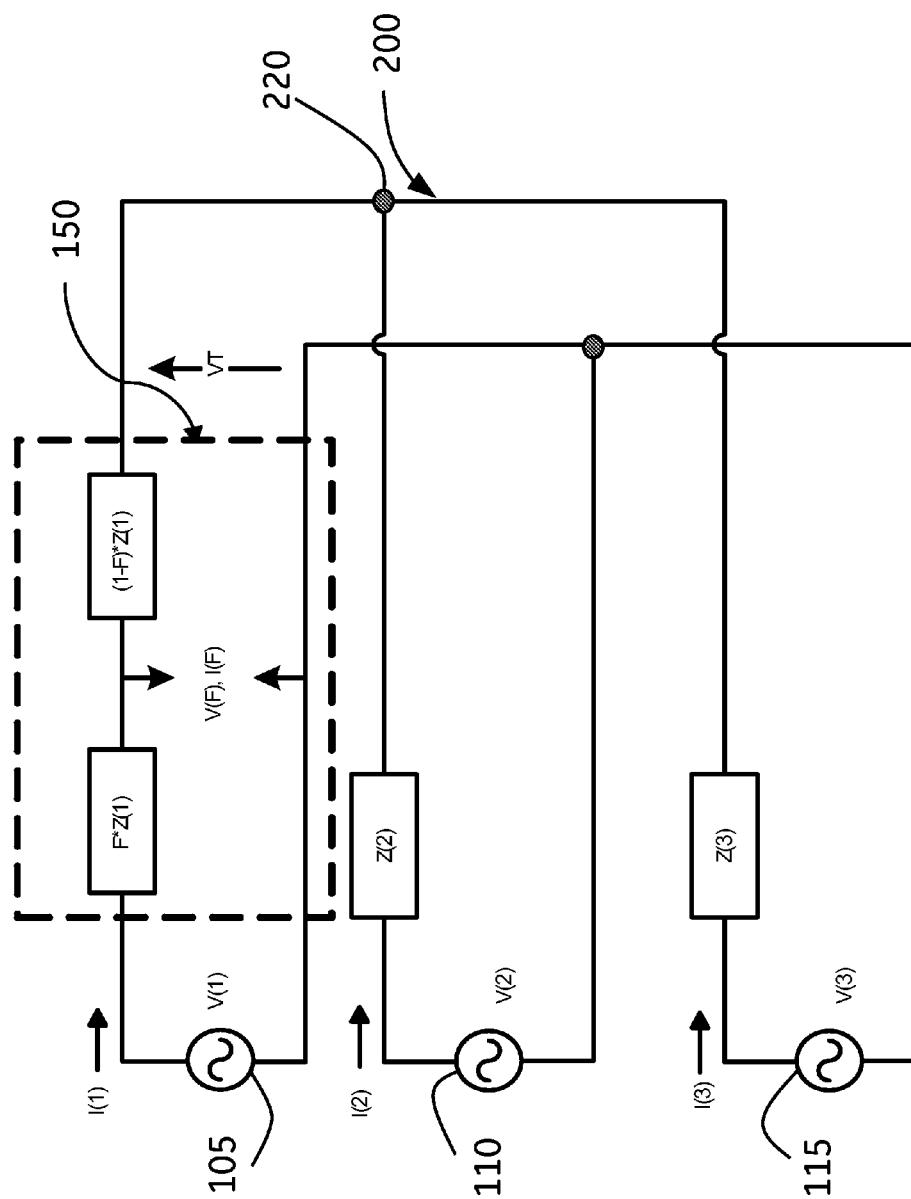
FIG. 2 is a schematic circuit diagram of a three-terminal fault detection system in accordance with another embodiment.

The two-terminal algorithm described above is readily extended to a three-terminal system 200, such as shown in FIG. 2. The situation for a three-terminal system 200 is illustrated for the case in which the fault 150 is on the line from the first terminal 105 to the tap 220. The situations for a fault 150 located on one of the other two line segments are not shown, but can be obtained by a cyclic permutation of line indices.

The following measurements and parameters are assumed to be available:

I(1), I(2), I(3)=composite current phasors flowing into first, second and third line segments V(1), V(2), V(3)=composite voltage phasors at first terminal 105, second terminal 110, and third terminal 115

Z(1), Z(2), Z(3)=complex composite impedance of first, second and third line segments L(1), L(2), L(3)=line lengths of first, second and third line segments It is, of course, the goal to determine which line segment has fault 150, and the distance of the fault 150 from the corresponding line terminal 105, 110, 115. The following parameters are used to determine the line with fault 150 and distance from a given terminal to the fault 150:

N=terminal index of the faulted line segment(=1, 2, or 3)

F=fractional fault location from Nth terminal 105, 110, 115

D=F·L(N)=distance from Nth terminal 105, 110, 115 to fault 150 location

Initially, three separate estimates of the voltage at the tap 220 are made, assuming unfaulted condition between the tap point and a given terminal, starting at each of the first, second and third terminals 105, 110, 115. The fault location algorithm thus uses the following estimates of the tap voltage:

$$VT(1)=V(1)-I(1) \cdot Z(1)$$

$$VT(2)=V(2)-I(2) \cdot Z(2) \quad (5)$$

$$VT(3)=V(3)-I(3) \cdot Z(3)$$

where VT(1), VT(2) and VT(3) are the tap voltages calculated from each of the first, second and third terminals 105, 110, 115, respectively.

Next, the line segment containing the fault 150 is determined. The determination of the line can be done by recognizing that the voltage drops around a loop through the unfaulted line segments will sum to zero. Residual voltage phasors are computed for each loop. The loop with the lowest residual voltage contains the two unfaulted line segments. In other words, only one line segment is faulted and the two unfaulted segments allow the two terminals to estimate the real tap voltage. As a result if a given pair of terminals determines the same tap voltage, the fault must be between the tap and the third terminal. The following equations are used to calculate the squared magnitudes of the residual voltage phasors in each loop as indicators:

$$R^2(1)=|VT(2)-VT(3)|^2$$

$$R^2(2)=|VT(3)-VT(1)|^2 \quad (6)$$

$$R^2(3)=|VT(1)-VT(2)|^2$$

where $R^2(1)$, $R^2(2)$, and $R^2(3)$ are the squared magnitudes. The index, N=1, 2 or 3, of the line containing fault 150 is the same as the smallest residual voltage phasor indicator. In the case where all of the indicators $R^2(1)$, $R^2(2)$, and $R^2(3)$ are approximately equal to each other, then the fault is close to the tap 220.

Once the index N of the line containing fault 150 is determined, the fault 150 is located using a formula derived for the two-terminal lines fed with data appropriate for that line segment. Each formula is obtained from any of the other formulae by a cyclic permutation of the indices N. The formulae for each index or line are given below. First, a best estimate of the voltage phasor at the tap point 220 and the fault current contribution from the tap 220 are computed using current phasors and the tap voltage estimates computed in equation (5), above:

$$\text{if } (N = 1): VT = \frac{VT(2) + VT(3)}{2}; \quad (7)$$
$$IT = I(2) + I(3); Z = Z(1);$$
$$\text{if } (N = 2): VT = \frac{VT(3) + VT(1)}{2};$$
$$IT = I(3) + I(1); Z = Z(2);$$
$$\text{if } (N = 3): VT = \frac{VT(1) + VT(2)}{2};$$
$$IT = I(1) + I(2); Z = Z(3);$$

The factional fault location from the terminal end 105 of the line segment containing fault 150 is then computed from the terminal 105 and tap current and voltage phasors. The tap point 220 acts exactly as the other terminal in the two-terminal algorithm. Therefore:

$$\text{if } (N = 1): F = \text{Real}\left[\frac{\frac{V(1) - VT}{Z} + IT}{I(1) + I(2) + I(3)}\right] \quad (8)$$

$$\text{if } (N = 2): F = \text{Real}\left[\frac{\frac{V(2) - VT}{Z} + IT}{I(1) + I(2) + I(3)}\right]$$

$$\text{if } (N = 3): F = \text{Real}\left[\frac{\frac{V(3) - VT}{Z} + IT}{I(1) + I(2) + I(3)}\right]$$

The actual distance down the particular line is subsequently computed by multiplying the fractional distance by the length of the affected line segment:

$$D = F \cdot L(N) \quad (9)$$

Equation (8) can be implemented at any or all of the three terminals 105, 110, 115 that have the necessary information available. All three results will be identical. It should be noted that some care must be taken with the fact that the three terminals 105, 110, 115 have different indices within each terminal in a peer-to-peer architecture such as described in the embodiment of FIG. 2. As will be appreciated, if all three communications channels are in operation, then all three terminals can compute the fault 150 location, whereas, if only two are in operation, then only one terminal 105, 110, 115 can perform the computation—the terminal 105, 110, 115 connected to both operational channels. If only one channel is operational, then faults cannot be detected or located using the system 200. As will be understood, all of the required measurements can be obtained and calculations can be made using conventional measuring and/or computing devices connected with or in communication with the transmission line circuit and communications paths and configured in accordance with the embodiments described herein.

In a further embodiment, the fault resistance can be calculated by computing the phase to ground voltages at the fault 150 by starting at the terminal voltages and subtracting voltage drops to the known fault location 150.

Fault resistance can be computed using the systems 100, 200 as well. Once the fault 150 is located, it is a simple matter to estimate the fault resistance. The details depend on the fault type and the number of terminals. The following explanation considers the two-terminal equations. The three terminal equations are similar, and one will understand how to obtain those equations from the two-terminal explanation below.

Figure 3:
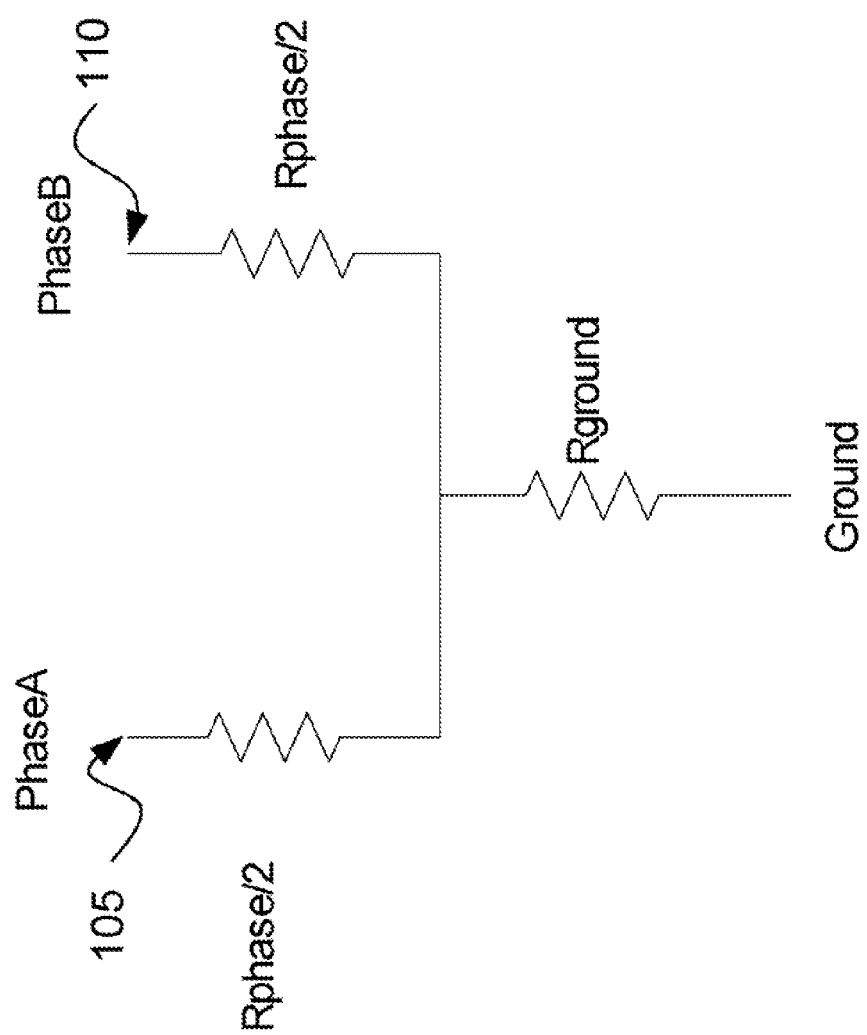
FIG. 3 is a schematic circuit diagram of a fault resistance model for the two-terminal circuit of FIG. 1.

For a single line to ground fault, the fault resistance is estimated by taking the real part of the ratio of the fault voltage and current phasors for the faulted phase. The voltage phasor is estimated by starting at the terminal end 105, 110, 115 where phase voltage phasors are known and subtracting the voltage drop at the fault 150. The possible effects of the mutual coupling from an adjacent line are considered. With reference to FIGS. 1 and 3, the case of a phase A to ground fault is considered. The equations for B to ground faults or C to ground faults (not shown in FIG. 3) are similar, except the quantities from the appropriate phase are used.

First, compute the zero sequence mutual coupling from the adjacent line:

$$Z0M = Z0 \cdot (Z0M/Z0) \quad (10)$$

(Z0M/Z0)=zero sequence coupling ratio

Then compute the distance to the fault:

$$D = F \cdot L \quad (11)$$

Calculate the portion of mutual coupling:

$$\text{if } (D < L_m) F_m = D/L_m \text{ else } F_m = 1 \quad (12)$$

Divide 3I0M of the adjacent line by 3, as follows:

$$I0M = 3I0M/3 \quad (13)$$

Compute the zero sequence current flowing into the local end of the transmission line:

$$I0(1) = (I_A(1) + I_B(1) + I_C(1))/3 \quad (14)$$

wherein the index 1 refers to the current measurements taken from the local terminal 105, 110. Then, estimate the phase to ground voltage at the fault 150:

$$V_A(F) = V_A(1) - F \cdot ((I_A(1) - I0(1)) \cdot Z + I0(1) \cdot Z0) - F_m \cdot I0M \cdot Z0M \quad (15)$$

and compute the fault current:

$$I_A(F) = I_A(1) + I_A(2) \quad (16)$$

wherein the index 1 again refers to the current measurements taken from the local terminal 105, 110, and index 2 refers to the current measurements taken from the remote terminal 110, 105. Finally, compute the fault resistance:

$$R_A(F) = \text{Real}\left(\frac{V_A(F)}{I_A(F)}\right) \quad (17)$$

The phase to phase fault resistance can be obtained more easily as follows. First, estimate the phase to phase voltage at the fault:

$$V_{AB}(F) = (V_A(1) - V_B(1)) - F \cdot (I_A(1) - I_B(1)) \cdot Z \quad (18)$$

where A and B designate the phase, and 1 is the index of the local terminal 105, 110. Then estimate the phase to phase fault current:

$$I_{AB}(F) = \frac{1}{2}(I_A(1) + I_A(2) - I_B(1) - I_B(2)) \quad (19)$$

Finally, compute the phase to phase resistance using the results of equations (18) and (19):

$$R_{AB}(F) = \text{Real}\left(\frac{V_{AB}(F)}{I_{AB}(F)}\right) \quad (20)$$

As will be appreciated, analysis of the phase to phase fault is simpler because zero sequence coupling is not a concern.

For the three phase fault situation, an equivalent fault resistance is reported as the real part of the ratio of the composite voltage to current at the fault 150. In the case of a three phase fault, a better estimate of the voltage at the fault 150 can be constructed by averaging the estimates using composite voltages and currents from both ends as follows:

$$V(F) = \frac{1}{2}(V(1) - F \cdot I(1) \cdot Z + V(2) - (1-F) \cdot I(2) \cdot Z) \quad (21)$$

so that the fault resistance is then:

$$R(F) = \text{Real}\left(\frac{V(F)}{I(1) + I(2)}\right) \quad (22)$$

Referring again to FIG. 3, the A phase to B phase ground fault is considered using the circuit model shown in FIG. 3. In order to account for zero sequence network involvement, the single line to ground fault equations are applied to each of phases A and B. First, the zero sequence mutual coupling from the adjacent line is computed:

$$Z0M = Z0 \cdot (Z0M/Z0) \quad (23)$$

(Z0M/Z0)=zero sequence coupling ratio

The distance to the fault is calculated as before:

$$D = F \cdot L \quad (24)$$

and compute the portion of mutual coupling:

$$\text{if } (D<L_m) F_m = D/L_m \text{ else } F_m = 1 \quad (25)$$

Then divide 3I0M of the adjacent line by 3:

$$I0M = 3I0M/3 \quad (26)$$

and compute the zero sequence current flowing into the local end 105, 110 of the transmission line:

$$I0(1) = (I_A(1) + I_B(1) + I_C(1))/3 \quad (27)$$

Next, estimate the phase to ground voltage at the fault for each of phases A and B:

$$V_A(F) = V_A(1) - F \cdot ((I_A(1) - I0(1)) \cdot Z + I0(1) \cdot Z0) - F_m \cdot I0M \cdot Z0M \quad (28)$$

$$V_B(F) = V_B(1) - F \cdot ((I_B(1) - I0(1)) \cdot Z + I0(1) \cdot Z0) - F_m \cdot I0M \cdot Z0M \quad (29)$$

and calculate the fault current for each of phases and A and B:

$$I_A(F) = I_A(1) + I_A(2) \quad (30)$$

$$I_B(F) = I_B(1) + I_B(2) \quad (31)$$

and use the results of equations (28) to (31) to determine the phase to phase resistance:

$$R_\phi \cdot (F) = 2 \cdot \text{Real}\left(\frac{V_A(F) - V_B(F)}{I_A(F) - I_B(F)}\right) \quad (32)$$

in order to finally compute the ground resistance of the fault 150:

$$R_g(F) = \frac{1}{2}\text{Real}\left(\frac{V_A(F) + V_B(F)}{I_A(F) + I_B(F)}\right) - \frac{R_\phi(F)}{4} \quad (33)$$

Thus, the resistance of the fault 150 can be computed in different ways as described above to account for fault type and mutual coupling. The fault resistance information combined with the fault location enables operators of power transmission lines to more effectively manage their systems. As discussed above, the information can be obtained from any terminal connected to the minimum number of other terminals to receive the necessary data for determining the fault location and/or fault resistance.

Figure 4:
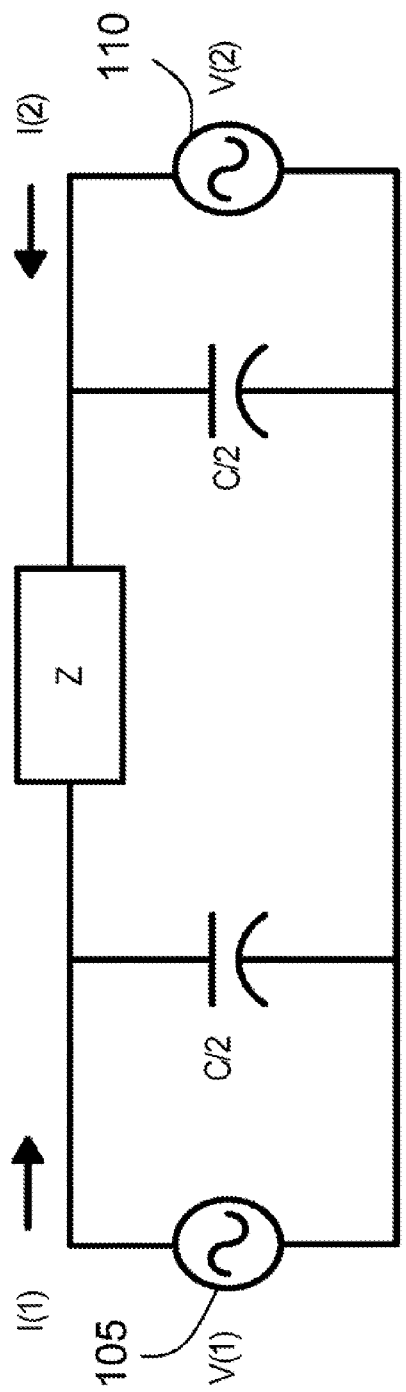
FIG. 4 is a schematic circuit diagram of a charging current compensation composite signal model accordance with a further embodiment.

In another embodiment of the invention, the multi-ended fault location system can include charging current compensation in the determination of the fault location to further enhance the accuracy of the fault locating system. Since the fault location system utilizes the composite signal network, the model circuit shown in FIG. 4 approximates the network reasonably well. The model of FIG. 4 is equivalent to presuming that the total charging current depends on the total line capacitance and the average of the voltages V(1), V(2) at both ends of the lines. The implicit assumption in this current compensation model is that the voltage on the line varies linearly along the line from one end to the other. This is true during normal (unfaulted) conditions, but is not true during faulted conditions. Accordingly, the result is that these assumptions are violated by a fault condition. This works well for fault detection, but requires a further investigation of the effect of charging current on fault location.

Figure 5:
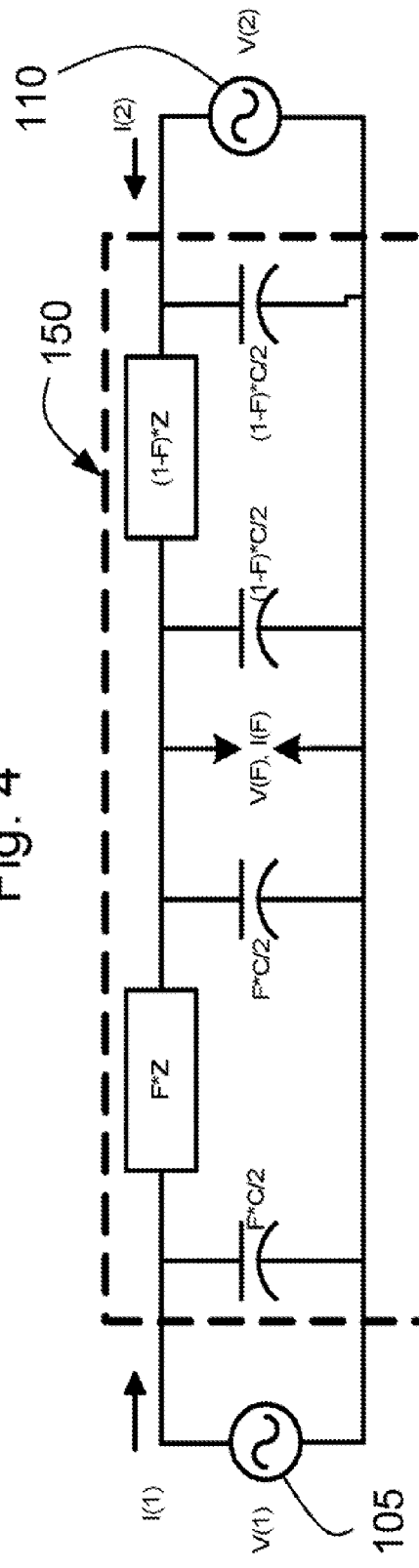
FIG. 5 is a modified schematic circuit diagram of the charging current compensation composite signal model of FIG. 4.

During a fault, the voltage profile on the line is approximately two straight lines from the terminals to the fault, which results in the model shown in FIG. 5. If a device is operating on the system in a charging current compensation mode, the composite current phasors on each line become:

$$\hat{I}(1) = I(1) - j\omega\frac{C}{2}V(1); \hat{I}(2) = I(2) - j\omega\frac{C}{2}V(2) \quad (34)$$

where C is the capacitance understood as the representing the composite charging current of the line under a composite excitation voltage. In practical situations this capacitance is equivalent to so called positive or negative sequence capacitances of the line.

It will be appreciated that it would be convenient to simply use the compensated current values of the line currents in the fault location algorithms (6), (7) and (8), above. Fortunately, after modifying the equation with some approximations which ignore differences between the model of FIG. 4 and that of FIG. 5, the currents in equation (34) can be used.

The equation for the composite voltage drop from the first terminal 105 to the fault 150, as shown in FIG. 5, is:

$$F \cdot I(1) \cdot Z = V(1) \cdot \left(1 + F^2 \cdot j\omega \frac{C}{2} \cdot Z\right) - V(F) \quad (35)$$

and the voltage drop from the second terminal 110 to the fault 150 is:

$$(1-F) \cdot I(2) \cdot Z = V(2) \cdot \left(1 + (1-F)^2 \cdot j\omega \frac{C}{2} \cdot Z\right) - V(F) \quad (36)$$

Equations (35) and (36) determine the relationships between voltages and currents that can be used subsequently to determine the accuracy of an estimate of fault location. The equations could alternatively be used to determine a least mean square estimate of fault location. However, the process leads to a fourth order polynomial in F, with rather complicated coefficients, so that it is not efficient to implement this algorithm to produce real time or near real time solutions because the numerical solution would have to be used in real-time as the fourth order polynomial cannot be solved priori in a general case. Since an approximation is needed anyway, a more efficient, simpler approach is to use the compensated currents given by equation (34) in the location algorithms and analyze the resulting error in fault location. Thus, the two-terminal location algorithm using compensated composite current phasors is:

$$F = \text{Real}\left[\frac{\frac{V(1)-V(2)}{Z} + \hat{I}(2)}{\hat{I}(1) + \hat{I}(2)}\right] \quad (37)$$

while the compensated current phasors are given by equation (34).

Now we will show that the above simplified solution is sufficiently accurate. The composite current phasors can be expressed in terms of the voltage at the fault 150 and the terminal 105, 110 voltages by rearranging the equations (35), (36) The current at the first terminal 105 is given by:

$$I(1) = \frac{V(1) \cdot \left(1 + F^2 \cdot j\omega \frac{C}{2} \cdot Z\right) - V(F)}{F \cdot Z} \quad (38)$$

and the current at the second terminal 110 is given by:

$$I(2) = \frac{V(2) \cdot \left(1 + (1-F)^2 \cdot j\omega \frac{C}{2} \cdot Z\right) - V(F)}{(1-F) \cdot Z} \quad (39)$$

As will be understood, it is convenient to express the fault voltage in terms of a disturbance relative to the open circuit voltage at the fault 150 by the following equation:

$$V_\Delta = (1-F) \cdot V(1) + F \cdot V(2) - V(F) \quad (40)$$

Substituting equation (40) into equations (38) and (39) produces the following equivalent expressions for the uncompensated currents in terms of the disturbance voltage:

$$I(1) = \frac{V(1)-V(2)}{Z} + F \cdot V(1) \cdot j\omega \frac{C}{2} + \frac{V_\Delta}{F \cdot Z} \quad (41)$$

$$I(2) = \frac{V(2)-V(1)}{Z} + (1-F) \cdot V(2) \cdot j\omega \frac{C}{2} + \frac{V_\Delta}{(1-F) \cdot Z} \quad (42)$$

Substituting equations (41) and (42) into equation (34) yields the following expression of the compensated current phasors:

$$\hat{I}(1) = \frac{V(1)-V(2)}{Z} - (1-F) \cdot V(1) \cdot j\omega \frac{C}{2} + \frac{V_\Delta}{F \cdot Z} \quad (43)$$

$$\hat{I}(2) = \frac{V(2)-V(1)}{Z} - F \cdot V(2) \cdot j\omega \frac{C}{2} + \frac{V_\Delta}{(1-F) \cdot Z} \quad (44)$$

Then, equations (43) and (44) are substituted into equation (37) to result in the following expression of computed fault location:

$$\text{Real}\left[\frac{\frac{V(1)-V(2)}{Z} + \hat{I}(2)}{\hat{I}(1) + \hat{I}(2)}\right] = \quad (45)$$

$$F \cdot \text{Real}\left[\frac{V_\Delta - F \cdot (1-F) \cdot Z \cdot V(2) \cdot j\omega \frac{C}{2}}{V_\Delta - F \cdot (1-F)^2 \cdot Z \cdot V(1) \cdot j\omega \frac{C}{2} - F^2 \cdot (1-F) \cdot Z \cdot V(2) \cdot j\omega \frac{C}{2}}\right]$$

It will be observed that the location algorithm of equation (45) is exact when there is no charging current. Further, equation (45) provides excellent accuracy for faults occurring near either end of the line because the error terms go to zero as F goes to 0 or 1. At the same time, the equation (45) produces highly accurate results when faults are located in other positions on the line as well. Even for the worst case for a fault near the middle of the line, the error is very small, which will be shown by the following analysis. For a fault located near the midpoint of the line, equation (45) produces the following approximation to the actual fault location:

$$\text{Real}\left[\frac{\frac{V(1)-V(2)}{Z} + \hat{I}(2)}{\hat{I}(1) + \hat{I}(2)}\right] \approx F \cdot \text{Real}\left[\frac{V_\Delta - Z \cdot V(2) \cdot j\omega \frac{C}{8}}{V_\Delta - Z \cdot V(2) \cdot j\omega \frac{C}{8} - Z \cdot (V(1)-V(2)) \cdot j\omega \frac{C}{16}}\right] \quad (46)$$

$$\approx F - \frac{1}{2}\text{Real}\left[\frac{Z \cdot (V(1)-V(2)) \cdot j\omega \frac{C}{16}}{V_\Delta - Z \cdot V(2) \cdot j\omega \frac{C}{8} - Z \cdot (V(1)-V(2)) \cdot j\omega \frac{C}{16}}\right]$$

A brief analysis reveals why equations (45) and (46) have small error even when the fault 150 is located near the midpoint of the transmission line. The following term in equation (46) represents a residual error:

$$\text{error} \approx -\frac{1}{2}\text{Real}\left[\frac{Z\cdot(V(1)-V(2))\cdot j\omega\frac{C}{16}}{V_\Delta - Z\cdot V(2)\cdot j\omega\frac{C}{8} - Z\cdot(V(1)-V(2))\cdot j\omega\frac{C}{16}}\right] \quad (47)$$

The following factor appears in several places in equation (47):

$$j\cdot Z\cdot \omega\cdot C \quad (48)$$

The factor is approximately related to the inductance and capacitance of the line by:

$$j\cdot Z\cdot \omega\cdot C \approx -\omega^2\cdot L\cdot C \quad (49)$$

The factor given by equation (49) is the square of the ratio of the power system frequency divided by the resonant frequency of the line, which is also the square of the ratio of the length of the line divided by one wavelength at power system frequency:

$$Z\cdot \omega \cdot C \approx -\omega^2 \cdot L\cdot C \approx -\frac{\omega^2}{\omega^2_{resonant}} \approx -\frac{D^2}{D^2_\lambda} \quad (50)$$

The factor given by equation (50) is rather small, so that equation (47) can be approximated by:

$$\text{error} \approx \frac{1}{32}\cdot \frac{D^2}{D^2_{resonant}}\cdot \text{Real}\left[\frac{(V(1)-V(2))}{V_\Delta}\right] \quad (51)$$

Each of the factors in equation (51) is small, so that even for a fault near the midpoint of the line, the error in the estimate of the fault location is small.

The following numerical example further illustrates the accuracy. Assume a 160-km line operated under a 30 degree voltage angle difference between the ends, with a single phase fault near the midpoint of the line. For a single-phase fault near the midpoint of a line, it can be shown that the disturbance voltage at the fault is approximately equal to ⅓ of the system voltage. The distance for a full wavelength at 60 Hz for typical lines is about 800 km. The magnitude of the voltage across the line is approximately equal to the system voltage times twice the sine of half the angle across the line. Therefore, the error for this example is:

$$|\text{error}| = \frac{1}{32}\cdot \left(\frac{160\,\text{km}}{800\,\text{km}}\right)^2 \cdot \frac{2\cdot \sin(30°/2)}{1/3} \approx 0.002 \approx 0.2\% \quad (52)$$

Thus, the error associated with using equation (37) with charging-current compensated currents for a 160 km long line is negligible. Using equation (51) it can also be seen that the residual error will grow as the square of the length of the line. For example, increasing the length of the line in the previous example from 160 km to 800 km will increase the error from 0.2% to 5%, establishing a practical upper limit on the applicability of simple charge compensation. In any case, for very long transmission lines, such as those longer than 800 km, it is well known in the art that charging current must be modeled by the differential equations that describe long transmission lines.

While the present invention has been described with references to preferred embodiments, various changes or substitutions may be made on these embodiments by those ordinarily skilled in the art pertinent to the present invention without departing from the technical scope of the present invention.

The application and configuration of the fault location system, as described herein and shown in the appended figures, is illustrative only. Although only a few embodiments of the invention have been described in detail in this disclosure, those skilled in the art who review this disclosure will readily appreciate that many modifications are possible (e.g. using polar versus rectangular coordinates for representing complex numbers, using a form of composite signals different from the expanded Clarke transform but still reflecting all fault types and being not sensitive to ground fault currents, etc.) without materially departing from the novel teachings and advantages of the subject matter recited in the appended claims. Accordingly, all such modifications are intended to be included within the scope of the present invention as defined in the appended claims. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the preferred and other exemplary embodiments without departing from the spirit of the embodiments of the invention as expressed in the appended claims. Therefore, the technical scope of the present invention encompasses not only those embodiments described above, but all that fall within the scope of the appended claims.

What is claimed is:

1. A fault position detection system for a power transmission line having at least two terminals and at least one line segment, the system comprising:
   a tap common to each of the at least two line segments wherein residual voltage and current values are determined;
   first means for representing three phase voltages and currents by composite current and voltage signals at each of the at least two terminals;
   second means for determining which of the line segments of the power transmission line is a faulted line segment containing a fault, using composite voltage and current phasor measurements of the composite current and voltage signals and the residual voltage and current signals at the node;
   third means for determining a fractional fault location from one terminal of the at least two terminals on the faulted line segment using the composite voltage and current phasor signals and the residual voltage and current values for each line segment at the node;
   fourth means for determining the position of the fault on the faulted line segment using the fractional fault location and length of the faulted line segment on which the fault is located.

2. The fault position detection system of claim 1 in which a single composite voltage and current are used to represent the composite voltage and current measurements at any one of the at least two terminals.

3. The fault position detection system of claim 1 in which the composite voltage and current signals are non-zero for any fault type.

4. The fault position detection system of claim 1 in which the composite voltage and current signals are not affected by the ground, or zero-sequence, currents.

5. The fault position detection system of claim 1 wherein the fault location can be determined without knowing the amount of mutual coupling with the adjacent line segments.

6. The fault position detection system of claim 1 wherein the fault type information is not required.

7. The fault position detection system of claim 1 wherein the fault location can be determined without knowing the zero-sequence impedance of the transmission line.

8. The fault position detection system of claim 1, further comprising fifth means for compensating the composite current phasors measured at each of the at least two terminals for line charging currents.

9. The fault position detection system of claim 1, further comprising resistance means for determining the resistance of the fault.

10. The fault position detection system of claim 9, wherein the resistance is one of phase to phase resistance and phase to ground resistance.

11. The fault position detection system of claim 1, wherein the second and third means are contained in N devices associated with N+1 of the at least two terminals, where N is greater than or equal to 1.

12. The fault position detection system of claim 1, wherein the second and third means are contained in a stand alone device not associated with any of the at least one terminals.

13. The fault position detection system of claim 1 which carries out the calculations immediately following occurrence of the fault using real-time data communications.

14. The fault position detection system of claim 1 integrated with protective relays, remote terminal units or other micro-processor based controllers used in conjunction with transmission lines.

15. A method for detecting fault position on a power transmission line having at least two terminals, at least two line segments and at least one common tap the method comprising:
  representing three phase voltages and currents by composite current and voltage signals at each of the at least two terminals;
  determining residual voltage and current values for each line segment at the common node;
  determining which of the line segments of the power transmission line is a faulted line segment containing a fault, using the composite voltage signals and the computed residual voltage values of the composite voltage signals;
  determining a fractional fault location from one terminal of the at least two terminals on the faulted line segment using the composite voltage and current phasor signals and residual voltage and current values;
  determining the position of the fault on the faulted line segment using the fractional fault location from one terminal of the at least two terminals and length of the faulted line segment on which the fault is located.

16. A method for detecting fault position according to claim 15, in which a single composite voltage and current are used for representing the composite voltage and current measurements at any one of the at least two terminals.

17. A method for detecting fault position according to claim 15, in which the composite voltage and current signals are non-zero for any fault type.

18. A method for detecting fault position according to claim 15, in which the composite voltage and current signals are not affected by the ground, or zero-sequence, currents.

19. A method for detecting fault position according to claim 15, wherein determining the fault location is done without knowing the amount of mutual coupling with the adjacent line segments.

20. A method for detecting fault position according to claim 15, wherein the fault type information is not required.

21. A method for detecting fault position according to claim 15, wherein determining the fault location is done without knowing the zero-sequence impedance of the transmission line.

22. A method for detecting fault position of claim 15, further comprising compensating the composite current phasors measured at each of the at least two terminals for line charging currents.

23. A method for detecting fault position according to claim 15, further comprising determining the resistance of the fault.

24. A method for detecting fault position according to claim 15, wherein determining the resistance comprises determining one of phase to phase resistance and phase to ground resistance.

25. A method for detecting fault position according to claim 15, wherein determining the line containing the fault and determining the fault position is done in N devices associated with N+1 of the at least two terminals, where N is greater than or equal to 1.

26. A method for detecting fault position according to claim 15, wherein determining the line containing the fault and determining the fault position are done in a stand alone device not associated with any of the at least one terminals.

27. A method for detecting fault position according to claim 15, wherein determining the line containing the fault and determining the fault position are done immediately following the fault using real-time data communications.

28. A method for detecting fault position according to claim 15, wherein determining the line containing the fault and determining the fault position are done at a delayed time following occurrence of the fault by gathering the data from all line terminals.

* * * * *